(12) United States Patent
Bunch et al.

(10) Patent No.: US 6,218,845 B1
(45) Date of Patent: Apr. 17, 2001

(54) SLOTLINE CALIBRATION STANDARD KIT FOR NETWORK ANALYZER AND CALIBRATION METHOD USING SAME

(75) Inventors: Tracy L. Bunch; Brian T. McWhirter, both of Redondo Beach; Gerald A. Cox, Playa del Rey; Steve K. Panaretos, Los Angeles; Steve E. Bradshaw, West Hills, all of CA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/398,389

(22) Filed: Sep. 17, 1999

(51) Int. Cl.$^7$ .................................................. G01K 35/00
(52) U.S. Cl. .......................... 324/601; 324/754; 333/33; 333/245
(58) Field of Search .................................... 324/663, 754, 324/601, 76.56, 602, 629, 637; 333/33, 245, 26

(56) References Cited

U.S. PATENT DOCUMENTS

| | | | |
|---|---|---|---|
| 4,535,307 | * 8/1985 | Tsukii | 333/35 |
| 4,967,173 | * 10/1990 | Watson | 333/260 |
| 5,854,559 | * 12/1998 | Miranda et al. | 324/754 |
| 5,910,754 | * 6/1999 | Simpson et al. | 333/17.3 |

OTHER PUBLICATIONS

Product Note 8510–5A, "Network Analysis–Specifyingcalibration standards for the HP 8510 network analyzer," Jan. 31, 1988, Hewlett–PackardCompany.
Product Note 8510–8, "Network Analysis–Applyingthe HP–8510B TRL calibration for non–coaxial measurements," Jan. 31, 1992, Hewlett–PackardCompany.

\* cited by examiner

Primary Examiner—Safet Metjahic
Assistant Examiner—Vincent Q. Nguyen
(74) Attorney, Agent, or Firm—Leonard A. Alkov; Glenn H. Lenzen, Jr.

(57) ABSTRACT

A RF precision calibration standard kit and calibration technique for "slotline" or slot transmission line for a network analyzer. The calibration standard kit establishes an accurate, repeatable reference plane at the slotline transmission interface. The calibration standard kit includes first and second coaxial to slot transmission line adapters, each adapter defining an adapter slot transmission line and having a slot connection port connected to an connection end of the slot transmission line and a coaxial connection coupled to the adapter slot transmission line. The kit further includes an offset component defining a section of slot transmission line, and a shorting plate. The first and second adapters, the offset component and the shorting plate are each adapted for connection to each other in a plurality of calibration configurations, including configurations for conducting Through, Reflection and Line measurements.

10 Claims, 5 Drawing Sheets

SLOTLINE CALIBRATION STANDARD KIT FOR NETWORK ANALYZER AND CALIBRATION METHOD USING SAME

TECHNICAL FIELD OF THE INVENTION

This invention relates to slot transmission line RF measurements, and more particularly to a slot transmission line calibration standard kit for use with a network analyzer and a technique for using the kit.

BACKGROUND OF THE INVENTION

In the field of microwave component design, a network analyzer is typically used to quantify the RF performance of a device. These performance measurements require a calibrated reference plane at the interface between the device under test and the test system to minimize errors introduced into the measurement by the test system. The reference plane is defined at the connection of the port(s) of the measurement system to the port(s) of the device under test. Furthermore, the ports of the test system include a transition (or adapter) to the transmission line utilized by the device under test.

An aspect of this invention is a precision calibration standard kit of components that will mate to a particular type of transmission media, slot transmission line, also known as "slotline" or "slotted line". Previous techniques for slotline measurements include calibration with coaxial or probe-coupled transition standards, which do not establish an accurate reference plane and provide no correction to translational errors. In addition, these previous techniques permit radiation losses in the slot adapters and probe-coupled transition, and interact with the slot transmission line, thereby producing errors that are not eliminated by the calibration standards.

The calibration standards and calibration techniques typically utilized during microwave measurements limit the network analyzer measurement accuracy.

It would therefore represent an advance in the art to provide a technique for establishing an accurate calibration for slotline measurements.

SUMMARY OF THE INVENTION

An aspect of this invention is an RF (Radio Frequency), precision calibration standard kit for "slotline" or slot transmission line. The calibration standard kit embodied in the present invention establishes an accurate, repeatable reference plane at the slotline transmission interface, and does not suffer from unaccountable radiative losses and positional errors that plague coaxial or probe-coupled transition calibration standards. These capabilities imply that this calibration standard kit produces accurate reflection, transmission, and time-domain-gated, bidirectional, two-port network analyzer measurements. The kit can be employed to perform Through, reflection and Line measurements, to calibrate the network analyzer for measurements at reference calibration plane surfaces on the adapters.

In an exemplary form, the precision calibration standard kit for slot transmission line ("slotline") includes first and second coaxial to slot transmission line adapters, each adapter defining an adapter slot transmission line and having a slot connection port connected to an connection end of the slot transmission line and a coaxial connection coupled to the adapter slot transmission line. The kit further includes an offset component defining a section of slot transmission line, and a shorting plate. The first and second adapters, the offset component and the shorting plate are each adapted for connection to each other in a plurality of calibration configurations, including configurations for conducting Through, Reflection and Line measurements.

BRIEF DESCRIPTION OF THE DRAWING

These and other features and advantages of the present invention will become more apparent from the following detailed description of an exemplary embodiment thereof, as illustrated in the accompanying drawings, in which.

DETAILED DESCRIPTION OF THE PREFERRED EMBODIMENTS

Figure 1:
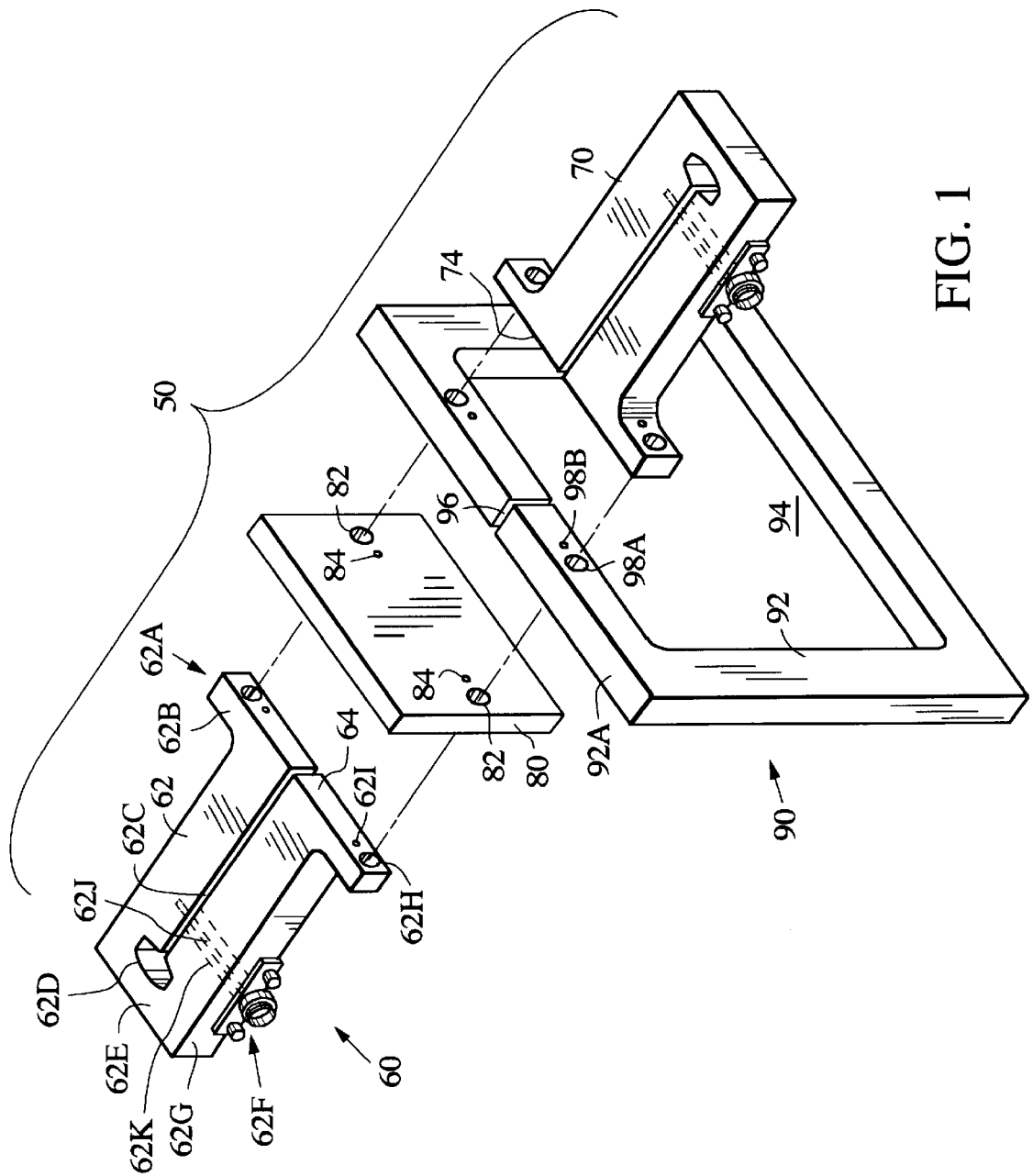
FIG. 1 is an isometric view of the four components that comprise the calibration standard in an exemplary embodiment.

FIG. 1 depicts the four components that comprise an exemplary calibration standard kit 50 in accordance with the invention. This kit 50 includes two coaxial (e.g.,3.5 mm SMA coaxial connector) to slot transmission line adapters (hereafter "adapters") 60, 70, a shorting plate 80, and a section of slot transmission line 90, i.e. an offset section.

The adapters 60, 70 are mirror images of each other, and so only adapter 60 will be described in detail. The adapter 60 includes a flat metal plate 62, typically aluminum, having a connection end 62A which defines a mounting flange an 62B. The plate 62 has a thickness of 0.150 inch in an exemplary embodiment. A slot having a width of 0.025 inch in this embodiment is defined in the plate 62, running between an opening 62D adjacent a coaxial end 62E and the connection end 62A. A coaxial connector 62F is mounted to a side edge 62G of the plate 62, and has a center conductor 62J which extends through a bore 62K formed through the plate and transversely through and across the slot, so that its tip is in electrical contact with (i.e. shorted to) the opposite sidewall of the slot. A dielectric (e.g. Teflon TM) sleeve supports the center conductor 62J in the bore 62K. The opening 62D is for RF tuning so that the transition between the coaxial connector 62F and the slotline will have a small mismatch.

The connection end 62A has formed therein a pair of fastener openings 62H and a pair of alignment tabs 62I for connection to other components of the kit 50 and to the circuit to undergo test. The connection end 62A defines a planar surface 64 which after the calibration process will represent a calibrated reference plane. The electrical length between the slot port at plane 64 and the coupling point on the slot line for the coaxial connector 62F is not critical, since it will be calibrated out during the calibration process.

The shorting plate 80 is fabricated of a conductive material, e.g. aluminum, and has a thickness of 0.25 inch in this exemplary embodiment. The plate 80 has formed therein adjacent opposite sides thereof pairs of fastener openings 82 and tab receiving openings 84. The fastener openings 82 align with corresponding fastener openings in other components including the openings 62H in the adaptor 60. The tab receiving openings 84 receive alignment tabs from other components including the tabs 62I of the adapter 60, to align accurately and repeatably the positions of the components during measurement/calibration operations. Alignment features are optional since the fields are localized near the slot mouth.

The section of slot transmission line 90, i.e. the offset section, comprises a metal frame member 92 fabricated from a metal plate of thickness 0.35 inch in this exemplary embodiment, and wherein a large opening 94 is defined therein. The interior size of opening 94 in this embodiment is 2 inches by 4 inches. A slot 96, 0.025 inch wide, is defined in the top rail 92A of the frame member 92. The interior opening dimensions are not critical since the fields are localized near the mouth of the slot 96. Also formed on opposite sides of the slot in the top rail are a pair of fastener openings 98A. On one side of the rail 92A are formed a pair of alignment tabs, e.g. tabs 98B in side 92B and on the other side are formed a pair of alignment openings to receive corresponding alignment tabs from another component. The configuration of the component 90 as having an open window 94 is not critical; the rails other than rail 92A serve primarily to maintain the gap 96.

The fastener openings, alignment tabs and alignment openings permit the components to be connected in various configurations. The openings, or some of them, can be threaded to receive threaded fasteners.

This exemplary embodiment of the kit 50 is designed for operation over a frequency range of 2 Ghz to 18 Ghz.

The components 60, 70, 80 and 90 are connected in three different combinations, which are illustrated in FIGS. 2A–4B, to calibrate a network analyzer 20 using the TRL (Through, Reflection, Line) method. The TRL method is known for calibrating network analyzers with coaxial and some noncoaxial components, and is described, e.g.,in Product Note 8510-5A, "Network Analysis-Specifying calibration standards for the HP 8510 network analyzer," Jan. 31, 1988, Hewlett-Packard Company, and Product Note 8510-8, "Network Analysis-Applying the HP 85101B TRL calibration for non-coaxial measurements," Jan. 31, 1992, Hewlett-Packard Company, the entire contents of which are incorporated herein by this reference. The network analyzer can be a HP 8510 type analyzer, but of course is not limited to an application using this network analyzer system.

Figure 2A:
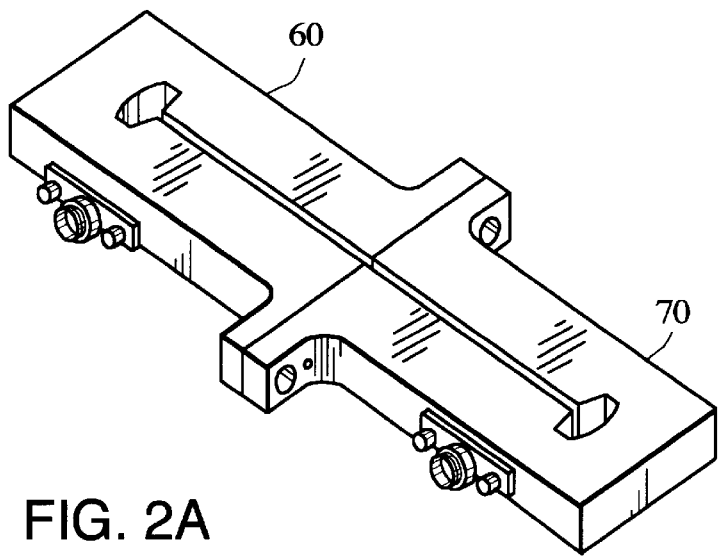
FIG. 2A is an isometric view of the Through calibration configuration using the calibration standard, wherein the two coaxial to slot transmission line adapters are connected in series.
Figure 2B:
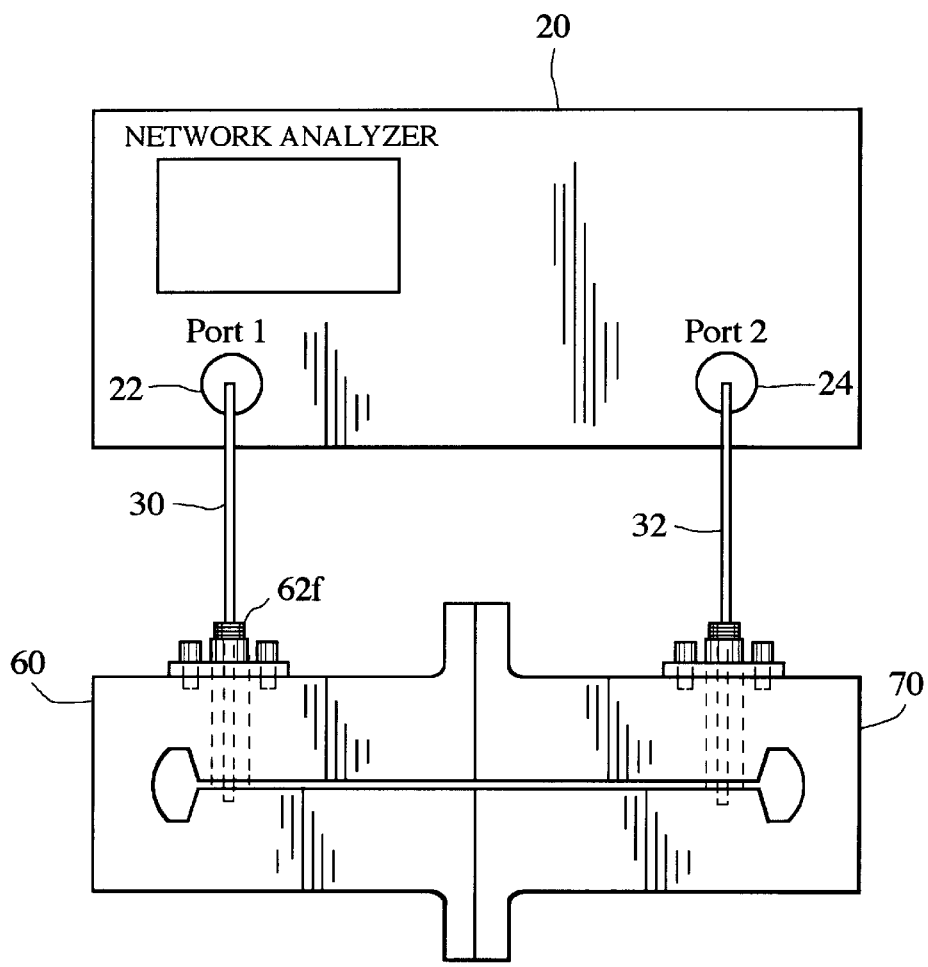
FIG. 2B is a diagrammatic depiction of this configuration with the network analyzer.

FIGS. 2A–2B depict the Through calibration configuration, wherein the two adapters 60, 70 are connected in series and also to the network analyzer 20 at ports 22, 24 through coaxial cables 30, 32. In a manner well known to those skilled in the art, calibration excitation signals are applied to the series connection of the adapters by the network analyzer 20 and corresponding response signals are recorded by the analyzer.

Figure 3A:
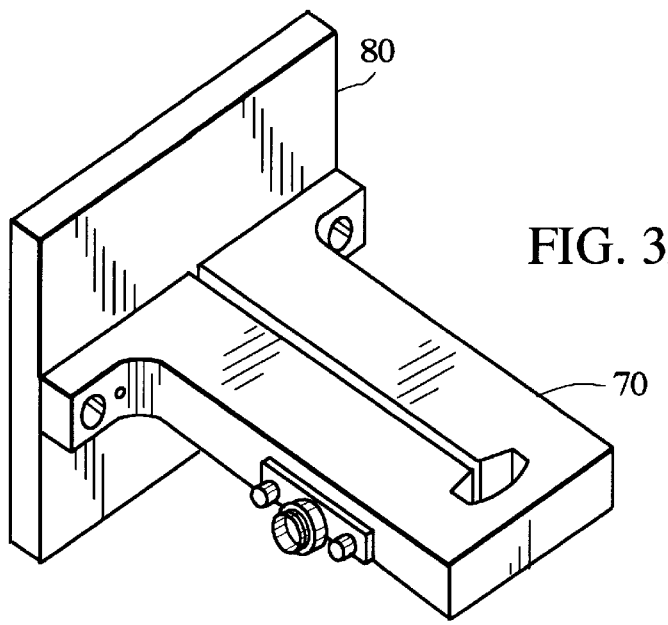
FIG. 3A is an isometric view of the Reflection calibration configuration, where one adapter is connected to the shorting plate.
Figure 3B:
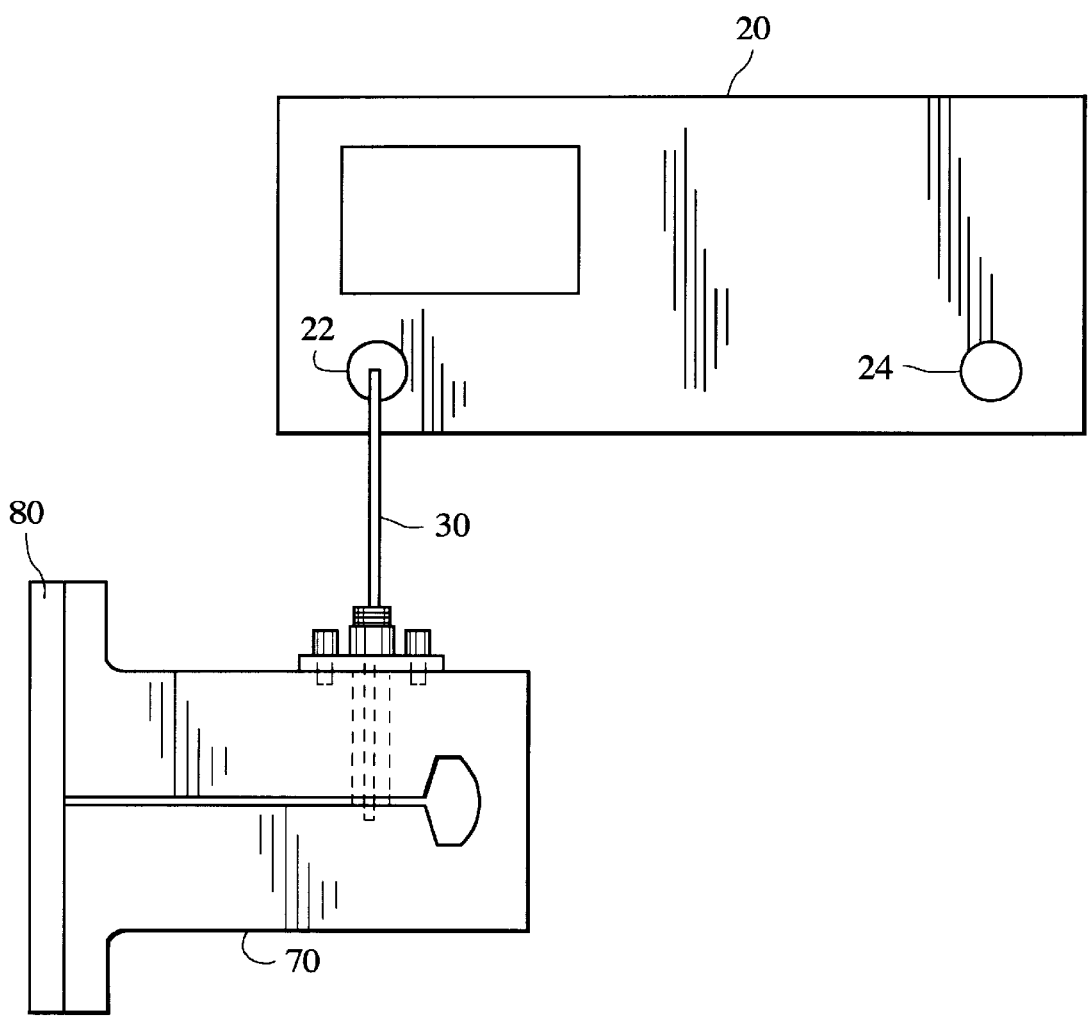
FIG. 3B is a diagrammatic depiction of this configuration with the network analyzer.

FIGS. 3A–3B depict the Reflection calibration configuration, where one adapter 60 or 70 is connected to the shorting plate 80 and to the network analyzer through a coaxial cable 30. Calibration excitation signals are applied to the adapter by the network analyzer 20 and corresponding response reflection signals are recorded by the analyzer. Both adapters 60, 70 are used, in separate measurements.

Figure 4B:
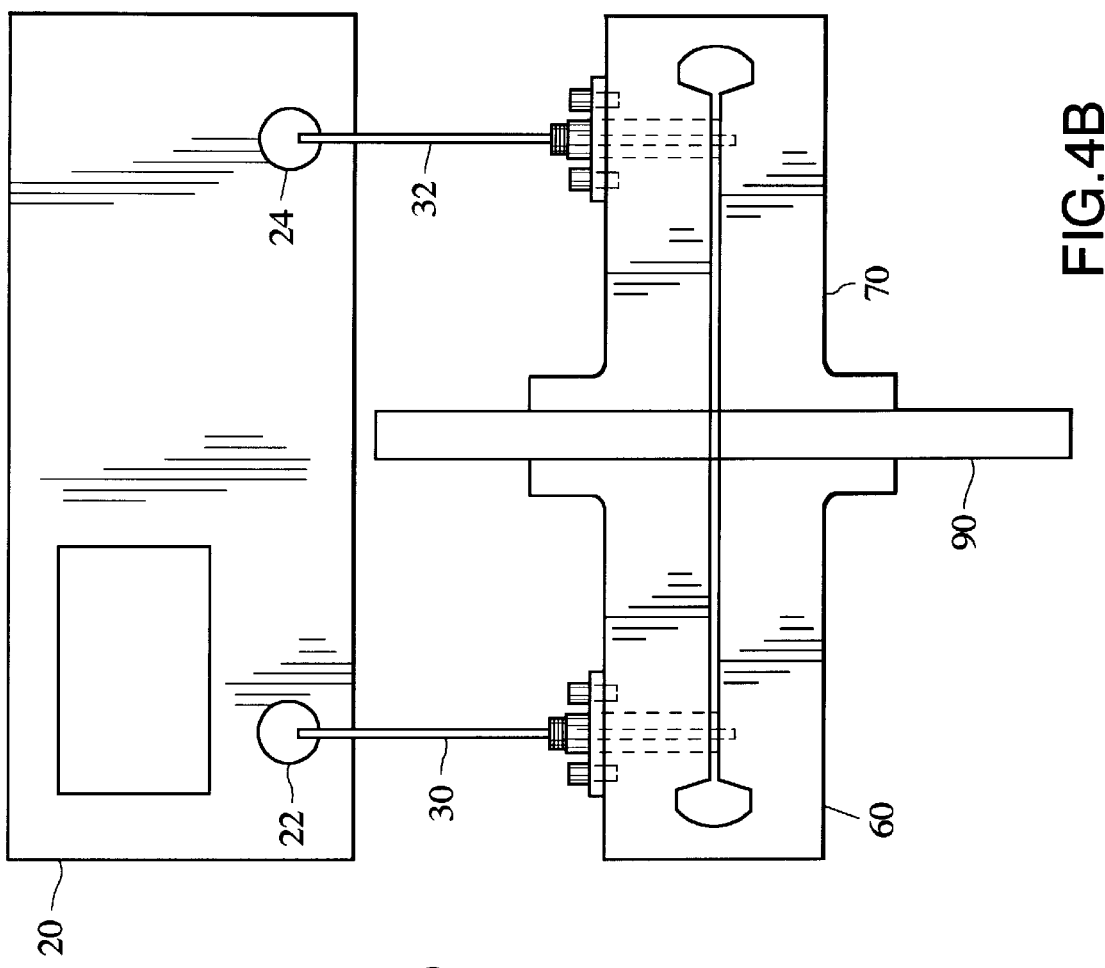
FIG. 4B is a diagrammatic depiction of this configuration.
Figure 4A:
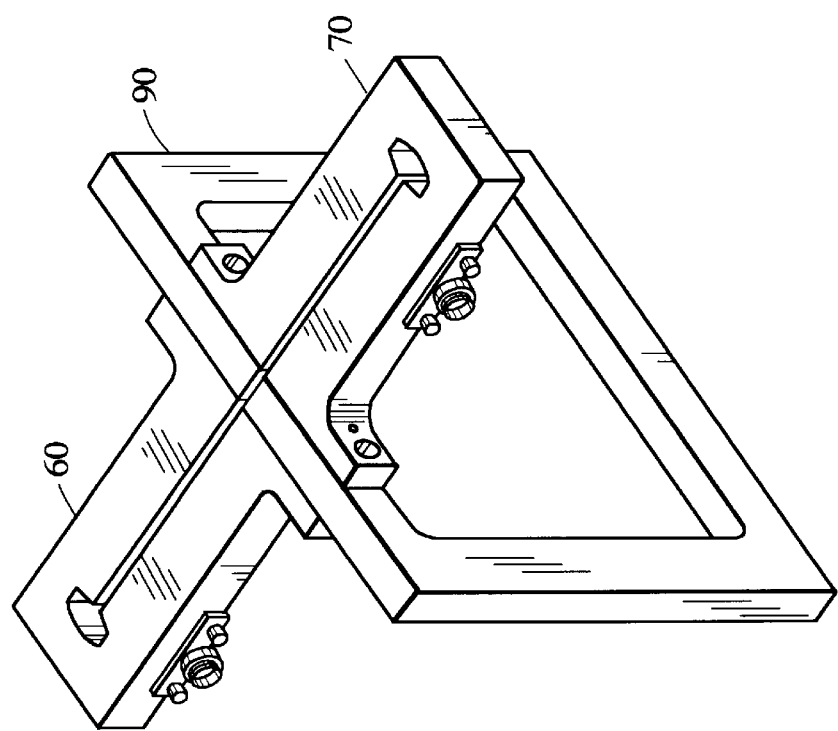
FIG. 4A is an isometric view of the Line calibration configuration, where a section of slot transmission line is connected in series with the two adapters to provide a phase offset.

FIGS. 4A–4B depict the Line calibration configuration, where the offset section 90 of slot transmission line is connected in series with the two adapters 60, 70 to provide a phase offset, and also to the network analyzer 20 via the coaxial cables 30, 32. Calibration excitation signals are applied to the adapters by the network analyzer 20 and corresponding response signals are recorded by the analyzer.

After all three of these measurements have been performed, the network analyzer 20 has sufficient calibration data to be accurately calibrated for slot transmission line measurements with reference planes 64, 74 at the slot port of the two 3.5 mm SMA to slot transmission line adapters 60, 70.

Figure 5:
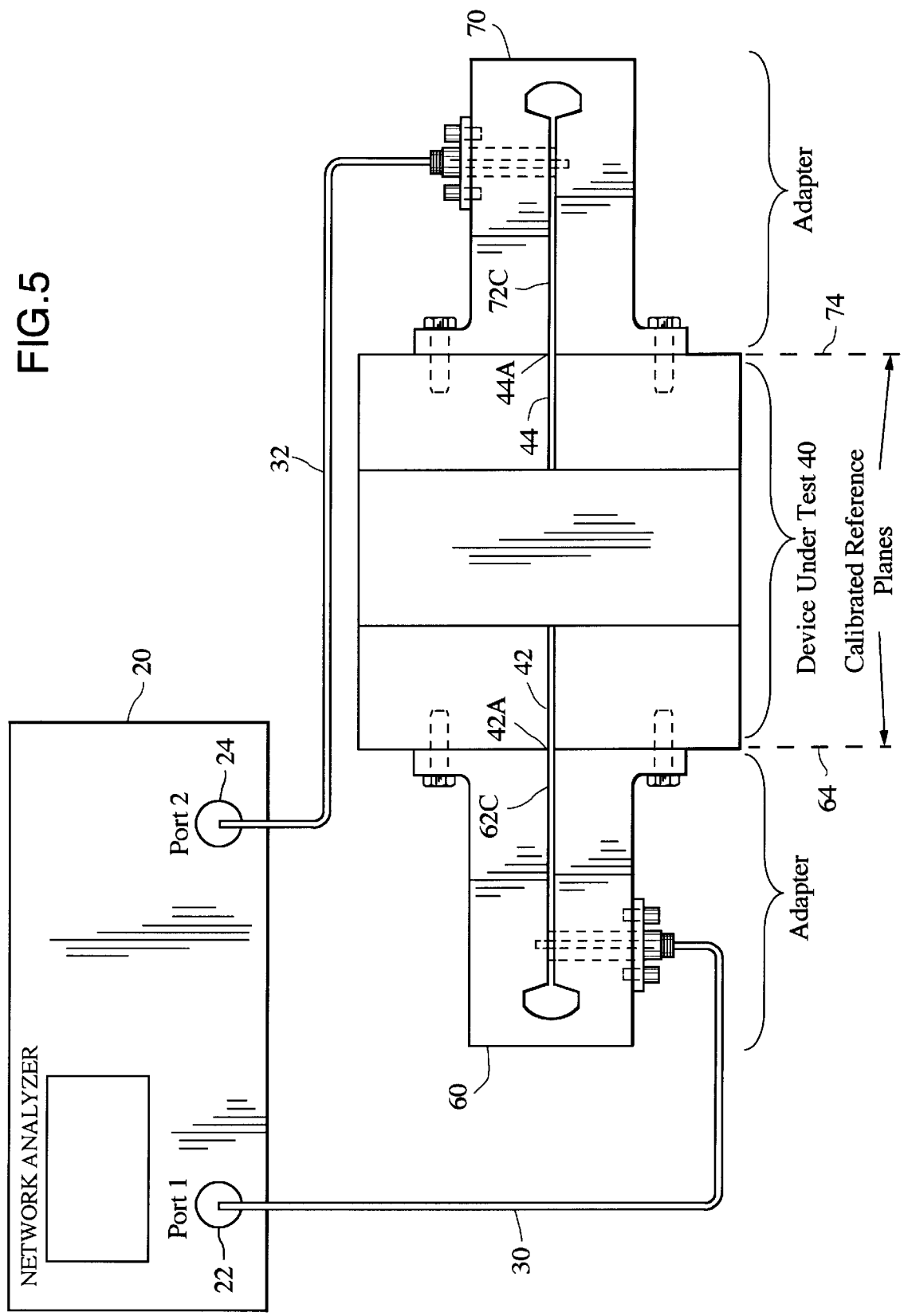
FIG. 5 illustrates an exemplary test set-up of a device 40 to undergo testing using the network analyzer after calibration using the calibration kit in accordance with the invention.

FIG. 5 illustrates an exemplary test set-up of a device 40 to undergo testing using the network analyzer 20. The device includes a first slotline portion 42 with a first slotline port 42A, and a second slotline portion 44 with a second slotline port 44A. The device 40 may typically include other circuitry and/or transmission lines. The device 40 is connected at its first port 42A to the first adapter 60, so that the slotline portion 42 is in communication with slotline 62C. Similarly, the device 40 is connected at its second port 44A to the second adapter 70 so that the slotline portion 44 is in communication with slotline 72C. Since the network analyzer is calibrated to the reference planes 64, 74, the device 40 can be tested accurately without introducing inaccuracies by the cables 30, 32 or adapters 60, 70.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. An RF (Radio Frequency), precision calibration standard kit for slot transmission line ("slotline"), comprising:

first and second coaxial to slot transmission line adapters, each adapter defining an adapter slot transmission line and having a slot connection port connected to a connection end of the slot transmission line and a coaxial connection coupled to the adapter slot transmission line;

an offset component defining a section of slot transmission line;

a shorting plate;

and wherein the first and second adapters, the offset component and the shorting plate are each adapted for connection to each other in a plurality of calibration configurations.

2. The kit of claim 1 wherein each of said coaxial to slot transmission line adapters includes a conductive plate structure having a slot formed therein to define the adapter slot line, the slot terminating at the slot connection port.

3. The kit of claim 2 wherein each of said coaxial to slot transmission line adapters includes a planar surface at said slot connection port, and wherein said planar surface provides a reference calibration plane after a calibration procedure.

4. The kit of claim 1 wherein the offset component includes a plate structure having a plate slot formed therein to define said section of slot transmission line.

5. The kit of claim 4 wherein the plate structure has first and second opposed planar surfaces, and said plate slot extends between said opposed planar surfaces.

6. The kit of claim 5 wherein the plate structure has a window opening formed therein, the plate structure forming a rectilinear frame about the window opening, the frame including rail sections, and wherein the slot is formed in one of said rail sections.

7. A method for calibrating a network analyzer using a slotline calibration kit, comprising the steps of:
  providing the slotline calibration kit, comprising first and second coaxial to slot transmission line adapters, each adapter defining an adapter slot transmission line and having a slot connection port connected to a connection end of the slot transmission line and a coaxial connection coupled to the adapter slot transmission line, an offset component defining a section of slot transmission line, and a shorting plate;
  performing a through calibration measurement with the network analyzer, comprising connecting the first and second coaxial to slotline adapters in a series connection, connecting the coaxial connector of the first adapter to a first port of the network analyzer, connecting the coaxial connector of the second adapter to a second port of the network analyzer, and exciting the series connection with measurement signals to obtain through calibration data;
  performing a first reflection calibration measurement, comprising connecting the shorting plate to the slot connection port of the first adapter, connecting the coaxial connector of the first adapter to the first port of the network analyzer, and exciting the first adapter with reflection measurement signals to obtain corresponding first response reflection signals;
  performing a second reflection calibration measurement, comprising connecting the shorting plate to the slot connection port of the second adapter, connecting the coaxial connector of the second adapter to the second port of the network analyzer, and exciting the second adapter with reflection measurement signals to obtain corresponding second response reflection signals;
  performing a line calibration measurement, comprising connecting the offset component in series between the first and second adapters to provide a phase offset, connecting the coaxial connector of the first adapter to the first port of the network analyzer, connecting the coaxial connector of the second adapter to the second port of the network analyzer, exciting the series connection with line excitation signals to obtain corresponding line response signals.

8. The method of claim 7 wherein each of said coaxial to slot transmission line adapters includes a planar surface at said slot connection port, and wherein said planar surface provides a reference calibration plane to which the network analyzer is calibrated after said calibration method has been performed.

9. The method of claim 8 further comprising the step of performing a measurement on a device under test, the device under test including a first slotline section terminating at a first slotline port, and a second slotline section terminating at a second slotline port, the measurement step including:
  connecting the slot connection port of the first adapter to the first slotline port of the device under test;
  connecting the slot connection port of the second adapter to the second slotline port of the device under test;
  connecting the coaxial port of the first adapter to the first port of the network analyzer;
  connecting the coaxial port of the second adapter to the second port of the network analyzer; and
  exciting the device under test with measurement signals.

10. The method of claim 7 wherein:
  said step of performing said through calibration measurement includes connecting the coaxial connector of the first adapter to the first port of the network analyzer by a first coaxial cable and connecting the coaxial connector of the second adapter to the first port of the network analyzer by a second coaxial cable;
  said step of performing said first reflection calibration measurement includes connecting the coaxial connector of the first adapter to the first port by the first coaxial cable;
  said step of performing said second reflection calibration measurement includes connecting the coaxial connector of the second adapter to the second port by the second coaxial connector; and
  said step of performing the line calibration measurement includes connecting the coaxial connector of the first adapter to the first port of the network analyzer by the first coaxial cable and connecting the coaxial connector of the second adapter to the first port of the network analyzer by the second coaxial cable.

* * * * *